United States Patent [19]

Borchert et al.

[11] 3,919,010

[45] Nov. 11, 1975

[54] METHOD FOR PRODUCING A SEMICONDUCTOR DEVICE WHICH IS PROTECTED AGAINST OVERVOLTAGE

[75] Inventors: Edgar Borchert; Karlheinz Sommer, both of Belecke, Germany

[73] Assignee: Licentia Patent-Verwaltungs-G.m.b.H., Frankfurt am Main, Germany

[22] Filed: Mar. 4, 1974

[21] Appl. No.: 448,042

[30] Foreign Application Priority Data

Mar. 2, 1973 Germany .......................... 2310453

[52] U.S. Cl. .............. 148/189; 148/187; 148/33.5; 357/13; 357/15; 357/38

[51] Int. Cl.[2] ........................................ H01L 7/44

[58] Field of Search .................. 148/33.5, 189, 188; 357/38, 15, 13

[56] References Cited

UNITED STATES PATENTS

| | | | |
|---|---|---|---|
| 2,954,308 | 9/1960 | Lyons | 148/189 X |
| 3,152,928 | 10/1964 | Hubner | 148/33.5 X |
| 3,345,221 | 10/1967 | Lesk | 148/33.5 X |

*Primary Examiner*—G. Ozaki

*Attorney, Agent, or Firm*—Spencer & Kaye

[57] ABSTRACT

A method for producing a semiconductor device which is protected against overvoltage and which includes a semiconductor body having at least one pn junction which is to take over a blocking voltage or a blockable metal-semiconductor contact. The semiconductor body is initially doped in a conventional manner to produce the necessary semiconductor layer sequence of the desired types of conductivity and thereafter the net doping is increased in a locally limited region of the pn junction or the blockable metal-semiconductor contact by the controlled introduction of an element which forms a characteristic impurity in the semiconductor body so that the breakthrough voltage of the pn-junction or of the blockable metal-semiconductor contact at the limited region is smaller than along the remainder thereof.

18 Claims, 12 Drawing Figures

METHOD FOR PRODUCING A SEMICONDUCTOR DEVICE WHICH IS PROTECTED AGAINST OVERVOLTAGE

BACKGROUND OF THE INVENTION

The present invention relates to a method for producing a semiconductor device which is protected against overvoltage and which includes a semiconductor body having at least one pn-junction which takes over the blocking voltage and/or at least one blockable metal-semiconductor contact.

For the dependable operation of semiconductor devices circuit measures must be taken which protect the semiconductor device against overvoltage. Even temporarily occurring voltage peaks which are above the breakthrough voltage of the device may lead to a worsening in the blocking characteristic or, under certain circumstances, even to the destruction of the device. This applies to semiconductor rectifiers as well as to the collector blocking voltage of transistors and particularly to the controllable semiconductor rectifiers, i.e., the thyristors.

In the unfired state a thyristor has a positive and a negative blocking characteristic depending on the polarity of the main current circuit, i.e., the thyristor initially blocks in both directions. The polarity of the positive blocking characteristic here corresponds to its forward direction. With a current pulse in the control electrode, the thyristor is fired and thus becomes conductive in the forward direction. In order to accomplish this, the control current must not fall below a certain minimum value, the firing current.

If the voltage applied to the device exceeds a certain value in the positive blocking direction, the so-called forward breakover voltage, the thyristor will also be switched into the conductive state, even without a gate-trigger pulse. This firing without control, the so-called overhead firing, may lead to destruction of the thyristor and must thus be avoided if possible. If, however, the thyristor is charged with a voltage in the negative blocking direction, the conditions are similar to those of a noncontrollable rectifier and thus the above-described problem of endangering the operability of the device is also present. Thus the permissible positive and negative periodic peak blocking voltage values are generally voltages which lie at a suitable distance from the forward breakover voltage or the reserve breakdown voltage, respectively.

It is known that a suitable configuration of the surface of a diode or a thyristor in the edge regions, where the pn- junction(s) which take over the blocking voltage end, permits a temporary overloading with relatively low energy. Generally, however, expensive protective measures, such as special external circuit elements, for example, cannot be avoided.

SUMMARY OF THE INVENTION

It is the object of the present invention to provide a method for producing a semiconductor device in which one or a plurality of pn-junctions taking over the blocking voltage, i.e., is reverse biassed and/or one or a plurality of blockable metal-semiconductor contacts, i.e., Schottky contacts are so designed that high-energy overvoltages can also be tolerated by the device without its electrical properties being impeded and without additional circuit measures being required.

This is accomplished according to the present invention by a method for producing a semiconductor device which is protected against overvoltage and which includes a semiconductor body having at least one rectifying junction, i.e., a pn-junction or a metal-semiconductor contact, to which a blocking voltage will be applied, wherein during doping of the semiconductor body the necessary semiconductor layer or layers with the intended conductivity type are initially produced in the usual manner and then the net doping of a spatially limited region of the layer of the semiconductor body forming said rectifying junction is increased by the subsequent controlled introduction of elements which form doping impurities into the semiconductor body so that the breakthrough voltages of the rectifying junction, i.e., the pn-junction or the metal-semiconductor contact is lower in these limited regions than in the remainder of the rectifying junctions.

The method according to the present invention provides the result that the breakthrough will take place precisely at the intended points in the semiconductor device and not, as in the prior art embodiments, at any arbitrary and unpredictable point and particularly in the edge zones of the device.

To protect a device with a pn-junction it is advisable to increase the net doping on the higher resistivity side of this pn-junction. This is effected in a particularly advantageous manner by a subsequent diffusion with a doping substance which diffuses at high speed and which is only slightly soluble in the semiconductor material.

Insofar as the high-ohmic zone is a region of n-type conductivity, it is advantageous according to the present invention to effect the subsequent setting of the higher net doping by the diffusion of an element of the VIth Main Group of the Periodic Table of Elements other than oxygen. Preferably, the element used for the diffusion is sulfur, by means of which it is easily possible to increase the level of the donor concentration of the weak n-type zone to twice its previous value. The net doping can thus easily be adapted to the intended breakthrough voltage. The maintenance of a spatially limited area during this setting or increasing of the net doping is accomplished by the use of conventional masking technique, by means of which various structures even possibly complicated arrangements, can be produced within relatively close tolerances.

The use of an element such as sulfur for the increase of the net doping provides the advantage that as a result of the high diffusion speed of sulfur, diffusion periods and temperatures can be utilized at which the already present structure and the already available layer sequence of different conductivity will not experience any noticeable changes in their positions. Additionally, the poor solubility of sulfur in the semiconductor material has the result that only small quantities of sulfur remain as residues in the penetrated edge zones of the semiconductor body during and after the diffusion and the higher doping of these regions is thus not noticeably changed. Since, for example, the solubility of the sulfur is less by several orders of magnitude than for example that of gallium or phosphorus, a sulfur doping will not have any adverse influence in regions which are highly doped with gallium or phosphorus.

DESCRIPTION OF THE PREFERRED EMBODIMENTS

Figure 1:
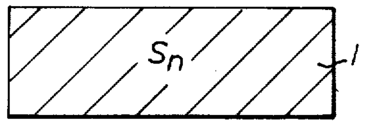
FIGS. 1–5 illustrate the various steps of the method according to the invention for producing a diode.
Figure 2:
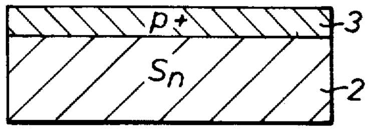

Referring now to FIG. 1 there is shown a semiconductor wafer 1 which consists, for example, of weak n-type ($s_n$) silicon as the starting material. In order to produce a diode a layer sequence of weak n-type and heavy p-type regions is desired and is first produced according to the known process steps of the semiconductor art, for example, by means of the conventional gallium diffusion. This results in the layer sequence 2, 3 of $s_n$ and $p^+$ doped layers as shown in FIG. 2.

Figure 3:
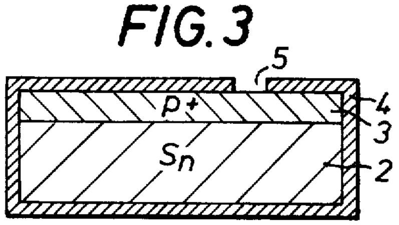

Thereafter as shown in FIG. 3 an oxide layer 4 is produced on the surfaces of the semiconductor wafer. The oxide layer 4 is provided, in a conventional manner with an opening 5 whose position shape and size corresponds to the region in the interior of the wafer in which the net doping is to be increased to cause the breakthrough to occur at this region. The thus masked wafer is then subjected to a sulfur diffusion which increases the donor concentration in region 6 of FIG. 4 to such an extent that it exhibits about 1.3 to 2 times the value of the donor concentration in the remaining portions of the $s_n$ zone 2 and thus the breakthrough voltage for the pn-junction in this n-type zone 6 will be smaller than the breakthrough voltage for the pn-junction along the remainder of the $s_n$ zone 2. After removal of the oxide layer 4, contacts 7, 8 are then applied to the semiconductor wafer in the usual manner resulting in the layer sequence shown in FIG. 5.

If a controlled avalanche diode is desired, the area of the region with the increased donor concentration must be sufficiently large and will then possibly occupy a predominant portion of the area of the pn-junction.

Figure 4:
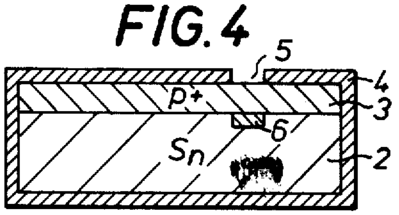
Figure 5:
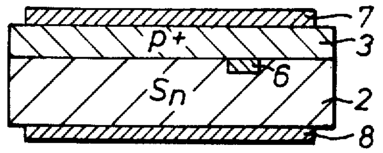
Figure 6:
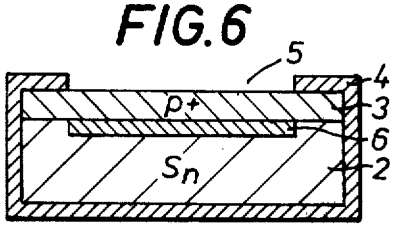
FIGS. 6 and 7 illustrate a modification of certain of the steps shown in FIGS. 1–5 in order to produce an avalanche diode.

In order to produce such an avalanche diode, instead of the dimensions shown in FIG. 4, the opening 5 of the oxide layer 4 is initially made in the appropriate size as shown in FIG. 6. During the subsequent sulfur diffusion the area of the higher doped n-type region 6 is then also enlarged to such an extent that transient overloads on the device from possibly occurring overvoltages can be absorbed without damaging it, and in particular that the edge regions of the device are relieved.

Figure 7:
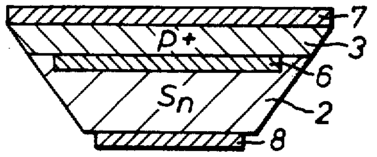

The further operating processing steps on the semiconductor wafer, such as removal of the oxide layer 4, the bevelling of the edges of the wafer and application of the contacts 7 and 8 are performed in the usual manner resulting finally in the arrangements shown in FIG. 7.

The selection of the diffusion conditions for the sulfur diffusion, particularly temperature, time and quantity of doping substance permit an accurate setting of the magnitude of the net doping in the breakthrough region 6 and thus also of the value of the breakthrough voltage in this region of the device.

It has been found advisable for performing the sulfur diffusion to place the wafers into a sealed quartz ampul filled with argon. During filling, the pressure of the argon should be about 200 Torr at room temperature so that the internal pressure of the ampul at the diffusion temperature will be approximately equal to the external pressure.

As a source of doping material a quartz vessel filled with elementary sulfur of a purity of about 99.999 percent is disposed inside the ampul. The quantity of sulfur is so dimensioned that at the diffusion temperature a partial sulfur pressure of about 10 Torr will develop. This value corresponds to approximately 1.2 mg sulfur per 150 $cm^3$ ampul volume.

The sulfur is diffused into the semiconductor wafer at the relatively low temperature of about 1000°C in a known manner for a duration of about 6 to 30 hours. The precise diffusion conditions are adapted to the thickness of the semiconductor wafers and the desired donor concentration, the diffusion periods in particular depending on the depth of the pn-junction.

According to a second example of another element of Group VI of the Periodic Table to be used, selenium is diffused into the semiconductor wafer at the temperature of about 1250°C in a known manner for a duration of about 1 to 3 hours. The quantity of selenium is so dimensioned that at the diffusion temperature a partial selenium pressure of about 10–40 Torr will develop. This value corresponds to approximately 1–5 mg selenium per 150 $cm^3$ ampul volume.

Figure 8:
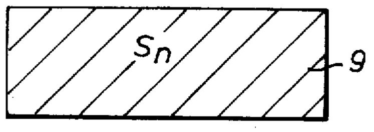
FIGS. 8–12 illustrate the various steps of the method according to the invention for producing a rectifying metal-semiconductor contact.
Figure 9:
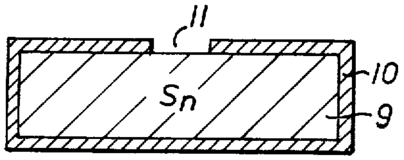
Figure 10:
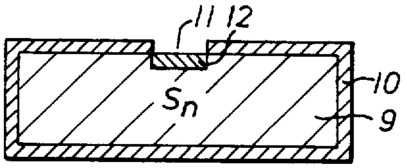
Figure 11:
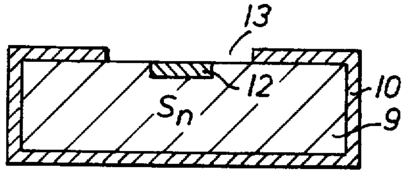
Figure 12:
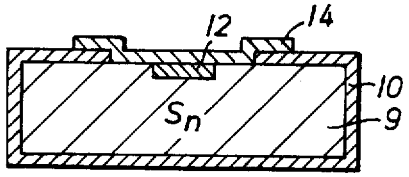

Referring to FIG. 8 there is shown a semiconductor wafer 9 which consists, for example, of weak n-type ($s_n$) silicon as the starting material. Thereafter as shown in FIG. 9 an oxide layer 10 is provided, in a conventional manner with an opening 11 whose position, shape and size corresponds to the region in the interior of the wafer in which the net doping is to be increased to cause the breakthrough to occur at this region. The thus masked wafer is then subjected to a sulfur or selenium diffusion which increases the donor concentration in region 12 of FIG. 10. After removal of the oxide layer 10 in the region 13 as shown in FIG. 11, the silicon surface is chemically cleaned and an Al film 14 is deposited and then defined by standard photoresist techniques as shown in FIG. 12 to form a diode with a rectifying metal-semiconductor contact, i.e., a Schottky diode.

It will be understood that the above description of the present invention is susceptible to various modifications, changes and adaptations, and the same are intended to be comprehended within the meaning and range of equivalents of the appended claims.

We claim:

1. In a method for producing a semiconductor device which is protected against overvoltage and which includes a semiconductor body having at least one rectifying junction which is to take over a blocking voltage, said method including the step of doping the semiconductor body in the usual manner to produce all of the semiconductor layers with the desired type of conductivity required to form said rectifying junction; the improvement comprising the step of thereafter increasing the net doping in a locally limited region along said rectifying junction by diffusing a doping substance, which forms doping impurities in the semiconductor material and which is soluble in the material of the semiconductor body only in a small quantity and diffuses in said material at a high speed relative to the already present doping impurities, into the semiconductor body in a controlled manner so that the breakthrough voltage of the rectifying junction at said region will be smaller than along the remainder thereof.

2. A method as defined in claim 1 wherein the rectifying junction is a metal-semiconductor contact wherein said semiconductor body is of a first conductivity type; wherein said step of increasing includes increasing the net doping of a locally limited region of said one conductivity type at a surface of said body; and wherein said method further includes applying a layer of metal which forms a rectifying junction with said semiconductor body to said surface to cover said region and the surrounding portion of said surface.

3. A method as defined in claim 1 wherein the device produced is a diode.

4. A method as defined in claim 1 wherein a transistor is produced.

5. A method as defined in claim 1 wherein the rectifying junction is a pn-junction wherein said step of doping includes doping a semiconductor body of one conductivity type to produce a less highly resistive semiconductor surface layer of the opposite conductivity type to form said pn-junction therebetween; and wherein said step of increasing includes increasing the net doping in a locally limited region within said semiconductor body and on the higher resistivity side of said pn-junction by diffusing a doping substance which produces said one conductivity type into said semiconductor body.

6. A method as defined in claim 5 wherein the device produced is a diode; wherein said one type of conductivity is n-type; and wherein the area of the higher doped n-type region extends over a predominant portion of the area of the pn-junction.

7. A method as defined in claim 5 wherein said step of diffusing includes diffusing said doping substance into the semiconductor body through said surface layer.

8. A method as defined in claim 5 wherein said doping substance is an element of the VIth Main Group of the Periodic Table of Elements other than oxygen.

9. A method as defined in claim 8 wherein the semiconductor body is initially doped with the conventional doping impurities from Groups III and V of the Periodic Table of Elements.

10. A method as defined in claim 1 wherein said doping substance is an element of the VIth Main Group of the Periodic Table of Elements other than oxygen.

11. A method as defined in claim 10 wherein said doping substance is sulfur.

12. A method as defined in claim 10 wherein said step of increasing the net doping further includes forming a diffusion mask, which has an opening corresponding to the shape, size and location of the desired spatially limited region, on the surface of the semiconductor body prior to said step of diffusing.

13. A method as defined in claim 12 wherein said diffusion mask is an oxide mask.

14. A method as defined in claim 10 further including placing the semiconductor body in a quartz ampul prior to said step of diffusing, and carrying out said step of diffusing in said quartz ampul.

15. A method as defined in claim 14 including filling the quartz ampul with an argon protective gas atmosphere prior to said step of diffusing and wherein the semiconductor wafers are doped in a protective argon gas atmosphere.

16. A method as defined in claim 15 wherein said step of filling includes placing the protective argon gas under a sufficient pressure so that the internal pressure of the ampul at the diffusion temperature is approximately equal to the outside pressure.

17. A method as defined in claim 16 wherein the doping substance is sulfur and wherein the diffusion is carried out at a temperature of approximately 1000°C.

18. A method as defined in claim 17 wherein the diffusion of sulfur takes place for approximately 6 to 30 hours.

* * * * *